US008787003B2

(12) United States Patent
Domes et al.

(10) Patent No.: US 8,787,003 B2

(45) Date of Patent: Jul. 22, 2014

(54) LOW INDUCTANCE CAPACITOR MODULE AND POWER SYSTEM WITH LOW INDUCTANCE CAPACITOR MODULE

(75) Inventors: Daniel Domes, Rüthen (DE); Reinhold Bayerer, Warstein (DE)

(73) Assignee: Infineon Technologies AG, Neubiberg (DE)

( * ) Notice: Subject to any disclaimer, the term of this patent is extended or adjusted under 35 U.S.C. 154(b) by 302 days.

(21) Appl. No.: 13/271,491

(22) Filed: Oct. 12, 2011

(65) Prior Publication Data

US 2013/0094122 A1 Apr. 18, 2013

(51) Int. Cl.

*H01G 4/228* (2006.01)
*H01G 4/008* (2006.01)
*H01G 4/06* (2006.01)
*H01G 2/08* (2006.01)
*H01G 9/00* (2006.01)
*H05K 5/02* (2006.01)

(52) U.S. Cl.

USPC ..... 361/538; 361/305; 361/306.2; 361/321.1; 361/514; 361/813; 174/529; 174/540

(58) Field of Classification Search

USPC ................ 361/305, 304, 306.2, 306.3, 321.1, 361/321.2, 328, 502, 512, 514, 515, 520, 361/522, 538, 299.2, 308.1, 310, 723, 772, 361/813; 257/787, 788, 789; 174/50.6, 528, 174/529, 536, 540, 551

See application file for complete search history.

(56) References Cited

U.S. PATENT DOCUMENTS 6,181,544 B1 1/2001 Nakagawa et al.
6,563,691 B2 5/2003 Kijima et al.
8,102,655 B2 * 1/2012 Sakamoto et al. ............ 361/723
2002/0125555 A1 * 9/2002 Akiyama et al. .............. 257/685
2006/0033209 A1 * 2/2006 Iimura et al. .................. 257/734
2007/0145576 A1 * 6/2007 Bayerer ........................ 257/723
2007/0253146 A1 * 11/2007 Inoue et al. ................... 361/328
2008/0204971 A1 * 8/2008 Lee et al. ................... 361/306.3
2010/0020469 A1 * 1/2010 Kurioka et al. ............ 361/321.1
2011/0228445 A1 9/2011 Abe et al.
2012/0020021 A1 * 1/2012 Kishimoto et al. ........... 361/695

FOREIGN PATENT DOCUMENTS

DE 19847029 A1 4/2000
EP 2523334 A1 11/2012
JP 2010245381 A 10/2010

OTHER PUBLICATIONS

Fan, J. et al. “Quantifying SMT Decoupling Capacitor Placement in DC Power-Bus Design for Multilayer PCBs”, IEEE Transactions on Electromagnetic Compatibility, Nov. 2001, pp. 588-599, vol. 43, No. 4.

(Continued)

*Primary Examiner* — Hoa C Nguyen
*Assistant Examiner* — Binh Tran
(74) *Attorney, Agent, or Firm* — Murphy, Bilak & Homiller, PLLC

(57) ABSTRACT

According to one embodiment of a capacitor module, the capacitor module includes a substrate having a metallization on a first side of the substrate, a plurality of connectors electrically coupled to the metallization and a plurality of capacitors disposed on the metallization. The plurality of capacitors includes a first set of capacitors electrically connected in parallel between a first set of the connectors and a second set of the connectors. The capacitor module further includes a housing enclosing the plurality of capacitors within the capacitor module.

19 Claims, 9 Drawing Sheets

(56) References Cited

OTHER PUBLICATIONS

Ye, X. et al. "DC Power-Bus Design Using FDTD Modeling With Dispersive Media and Surface Mount Technology Components", IEEE Transactions on Electromagnetic Compatibility, Nov. 2001, pp. 579-587, vol. 43, No. 4.

Stockmeier, T. "From Packaging to "Un"-Packaging—Trends in Power Semiconductor Modules", 20th International Symposium on Power Semiconductor Devices and IC's, 2008. ISPSD '08, May 18-22, 2008, pp. 12-19, Orlando, Florida.

* cited by examiner 100
104
108
116
114
120
162
152
DC-
112
160
150
DC+
110
106
118
102

LOW INDUCTANCE CAPACITOR MODULE AND POWER SYSTEM WITH LOW INDUCTANCE CAPACITOR MODULE

TECHNICAL FIELD

The present application relates to low inductance capacitors, in particular low inductance capacitor modules for power systems.

BACKGROUND

Typical power converter systems use electrolytic or foil capacitors to realize DC link and/or snubber circuits. For example, the DC link in an AC-DC-AC converter is normally equipped with an electrolytic capacitor which provides decoupling between a rectifier and an inverter. Snubbers are circuits which are placed across power semiconductor devices for protection and to improve performance. A snubber used in the case of IGBT (insulated gate bipolar) switches usually has no resistors or diodes. Instead the snubber is merely used to lower the effective inductance of the system by taking the amount of energy stored in the stray inductors between a DC-link-capacitor bank and itself. As a consequence, the inductance between the snubbers and modules should be as low as possible which means that the snubbers should be connected in a low inductance way as close as possible to the semiconductor module. In each case, the capacitors used in power converter systems are conventionally packaged in cylindrical aluminum tubes (electrolytic capacitor) or in cuboid plastic or metal boxes.

Screws or solder terminals are typically used to connect electrolytic and foil capacitors to a metal sheet or busbar of a power module. In some cases the snubber capacitors are directly mounted to the power terminals of the power module. However conventional capacitor types and connection techniques have several disadvantages. For example, forming screw-based connections is relatively time consuming in that each capacitor is individually screwed down to a terminal on a metal sheet or busbar. Solder-based connections have well known reliability issues. In addition to the shortcomings associated with conventional capacitor attach techniques, terminal constructions typically used in power modules concentrate current flow to a relatively narrow path and therefore increase inductance. High inductance is undesirable for many types of power system applications. Also, heat transfer is not optimal with conventional capacitor types and connection techniques due to the lack of a thermally efficient capacitor-cooler interface.

SUMMARY

A capacitor module includes capacitors mounted on a heat transfer carrier such as a DBC (direct bonded copper) substrate, a DAB (direct aluminum bonded) substrate, an AMB (active metal brazed) substrate, an IMS (insulated metal substrate) or similar substrate. The substrate can be connected thermally to a cooler. Electrical connections to busbars within the capacitor module can be arranged to provide a low inductance by using several single terminals in parallel for achieving a line-wise connector. The height of the capacitor module can be the same height as a power module used in conjunction with the capacitor module, e.g. as part of a DC-link or snubber circuit. Both module types can be mounted on the same cooler and PCB (printed circuit board) or on different coolers and/or PCBs. The connection pins to the capacitor module enable heat transfer out of the PCB to a cooler, which means the PCB metallization can be made thinner. The capacitor module terminals can be disposed close to the module border, shortening the length of the PCB. The capacitor module can be used in applications other than power systems.

According to an embodiment of a capacitor module, the capacitor module includes a substrate having a metallization on a first side of the substrate, a plurality of connectors electrically coupled to the metallization and a plurality of capacitors disposed on the metallization. The plurality of capacitors includes a first set of capacitors electrically connected in parallel between a first set of the connectors and a second set of the connectors. The capacitor module further includes a housing enclosing the plurality of capacitors within the capacitor module.

According to an embodiment of a power system, the power system includes a cooler, a capacitor module on the cooler, a power semiconductor module on the cooler and an electrical connection medium electrically connected to the capacitor module and the power semiconductor module. The capacitor module includes a substrate having a metallization on a first side of the substrate, a plurality of connectors electrically coupled to the metallization, a plurality of capacitors disposed on the metallization and including at least a first set of capacitors electrically connected in parallel between a first set of the connectors and a second set of the connectors, and a housing enclosing the plurality of capacitors within the capacitor module;

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
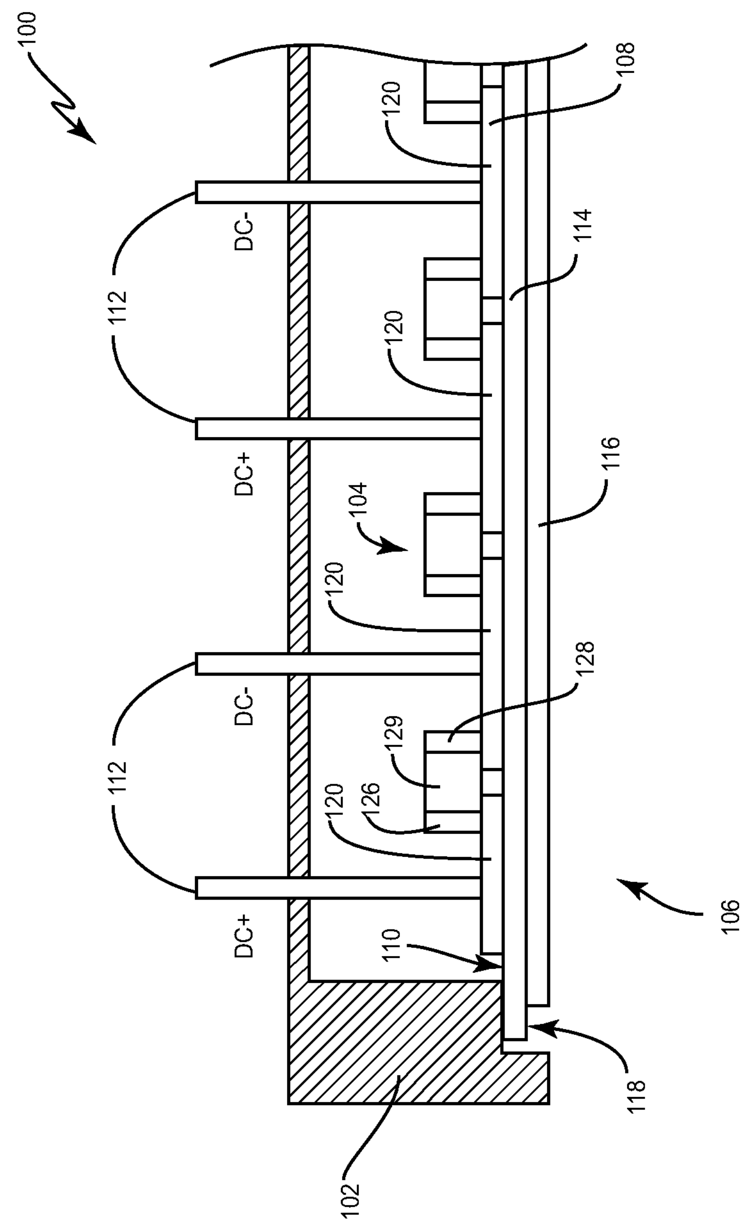
FIG. 1 illustrates a cross-sectional view of a capacitor module.
Figure 2:
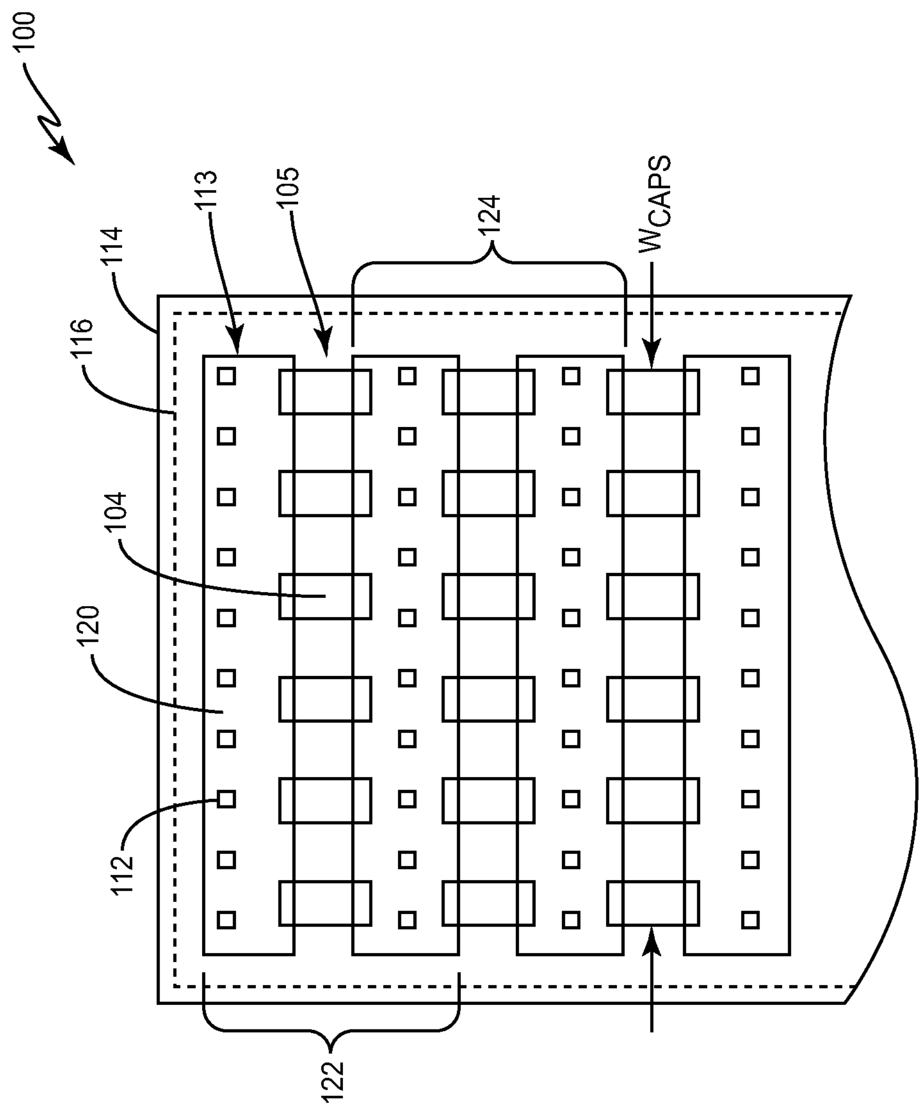
FIG. 2 illustrates a plan view of the capacitor module of FIG. 1 without a housing.

FIG. 1 illustrates a cross-sectional view of an embodiment of a capacitor module 100 along the line labelled A-A' in FIG. 2, and FIG. 2 illustrates a top plan view of the capacitor module 100 without a housing 102. The capacitor module 100 includes a plurality of capacitors 104 enclosed by the housing 102 as shown in FIG. 1. Electronic circuitry to which the capacitors 104 are eventually coupled is not included in the capacitor module 100, hence the use of the term 'capacitor module' instead of just module. The capacitor module housing 102 may be made of plastic or any other suitable type of material. The capacitor module 100 also includes a substrate 106 which has a metallization 108 on a top side 110 of the substrate 106. A plurality of connectors 112 are electrically coupled to the metallization 108 directly or through the capacitors 104. The capacitors 104 housed within the capacitor module 100 can be ceramic capacitors or any other suitable type of capacitor. For example, the capacitors 104 can be surface mount devices (SMDs).

Figure 9:
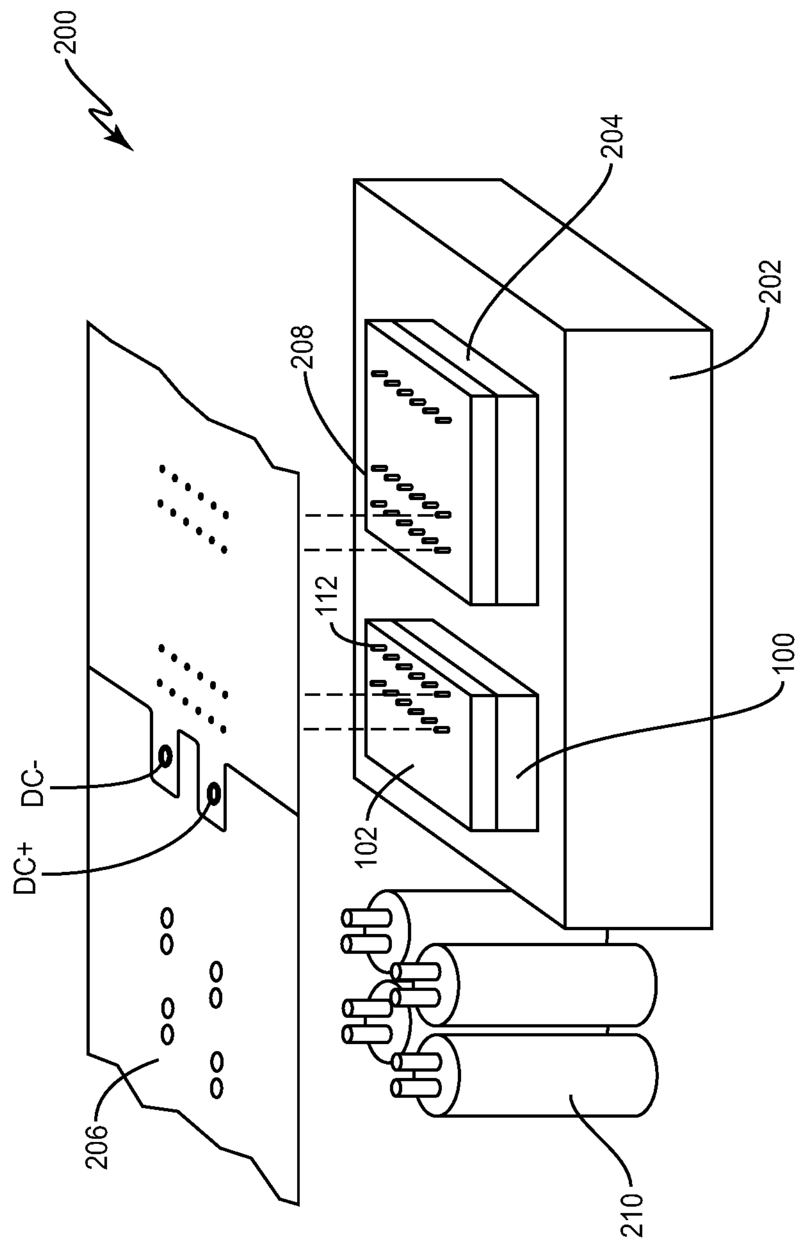
FIG. 9 illustrates a perspective view of a power system including a capacitor module and a power semiconductor module on a cooler.

In the embodiment shown in FIGS. 1 and 2, the substrate 106 includes a ceramic carrier 114 and the metallization disposed on the top side 110 of the ceramic carrier is patterned. A second metallization 116 is disposed on the bottom side 118 of the ceramic carrier 114. The substrate 106 shown in FIG. 1 may be a direct copper bonded (DCB) substrate, a direct aluminum bonded (DAB) substrate or an active metal brazed (AMB) substrate. At least part of the metallization 116 on the bottom side 118 of the ceramic carrier 114 can be exposed through an opening in the housing 102 to facilitate a good thermal connection with a cooler such as a heat sink to which the capacitor module 100 is mounted (e.g. as shown in FIG. 9). Such a connection ensures the capacitor module 100 has good thermal dissipation characteristics. Alternatively, the substrate 106 may be an insulated metal substrate (IMS) or similar substrate which includes a metal baseplate (e.g. made of aluminum or copper) covered by a dielectric layer such as epoxy and a metal layer such as copper or aluminum on the dielectric layer. Still other types of substrates 106 may be used to mount the capacitors 104.

Again according to the embodiment shown in FIGS. 1 and 2, the metallization 108 on the top side 110 of the substrate 106 is patterned and includes a plurality of elongated regions 120 (also referred to herein as busbars) which are separated from one another. A first set of the capacitors 104 are connected in parallel between a first pair 122 of the busbars 120, a second set of the capacitors 104 are connected in parallel between a second pair 124 of the busbars 120, etc. For example in FIGS. 1 and 2, the upper row 105 of capacitors 104 are in parallel and each have a first end 126 (terminal) directly connected to the upper busbar 120 of the first pair 122 and a second end 128 directly connected to the other busbar 120 of the first pair 122 so that these two busbars 120 are capacitively coupled together. Other rows 105 of capacitors 104 are similarly connected in parallel between two different busbars 120. In general, each set of capacitors 104 is arranged in a row 105 and connects adjacent busbars 120 in a parallel manner. Any number of capacitor rows 105 may be included in the capacitor module 100. In the embodiment illustrated in FIGS. 1 and 2, adjacent pairs 122, 124 of busbars 120 share a common busbar so that one end 128 of the capacitors 104 included in the first set of capacitors 104 and one end 126 of the capacitors 104 included in the adjacent second set of capacitors 104 are connected to the same busbar 120.

Each busbar 120 is electrically connected to a row 113 of connectors 112 which extend outside the module housing 102 at the opposite end for providing external electrical connection points. In one embodiment, the connectors 112 are electrically conductive pins. However, any other type of parallel connector arrangement can be used such as rows of solder terminals, rows of press-fit terminals, rows of spring contacts, rows of screw terminals, flexible cables with parallel wires separated by an insulating material, etc.

Each row 113 of connectors 112 can be coupled to a supply voltage or signal line outside the module housing 102. For example, in FIG. 1 a first row 113 of connectors 112 is mounted to a first busbar 120 at one end and coupled to a positive DC supply voltage (DC+) at the other end, a second row 113 of connectors 112 is mounted to a second busbar 120 at one end and coupled to a negative DC supply voltage (DC−) at the other end, etc. This way, each set 105 of capacitors 104 connected in parallel between a pair 122, 124 of busbars is electrically connected in parallel between DC+ and DC−.

Each row 113 of connectors 112 can be spaced apart over a collective width ($W_{CAPS}$) of the capacitors 104 connected to the corresponding busbar 120. Providing such a spaced apart connection of the connectors 112 to the respective busbars 120 spreads the current over the width of the corresponding sets 104 of capacitors 104 inside the capacitor module 100, decreasing the inductance of the capacitor module 100. Such a reduced inductance is advantageous for many types of applications, particularly for power systems where a lower gate inductance yields faster response time (e.g. switching from an on-state to an off-state and vice-versa) which improves performance and yields faster fault detection.

Figure 3:
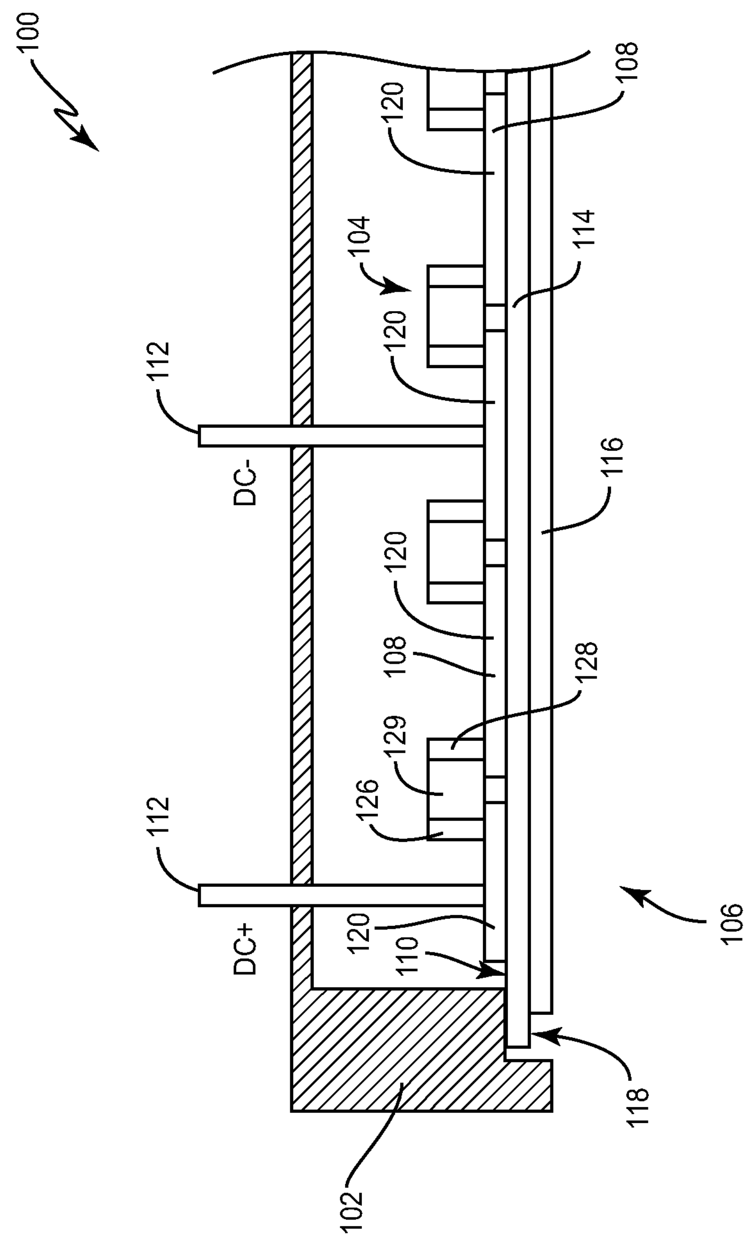
FIG. 3 illustrates a cross-sectional view of a capacitor module.

FIG. 3 illustrates a cross-sectional view of an embodiment of a capacitor module 100 which is similar to the one shown in FIG. 1, however the 2-level (DC+, DC−) power connections are in series within the capacitor module 100. As such, one row 105 of paralleled capacitors 104 is connected in series with a second row 105 of paralleled capacitors 104 between the connectors 112 coupled to the DC+ and DC− supplies.

Figure 4:
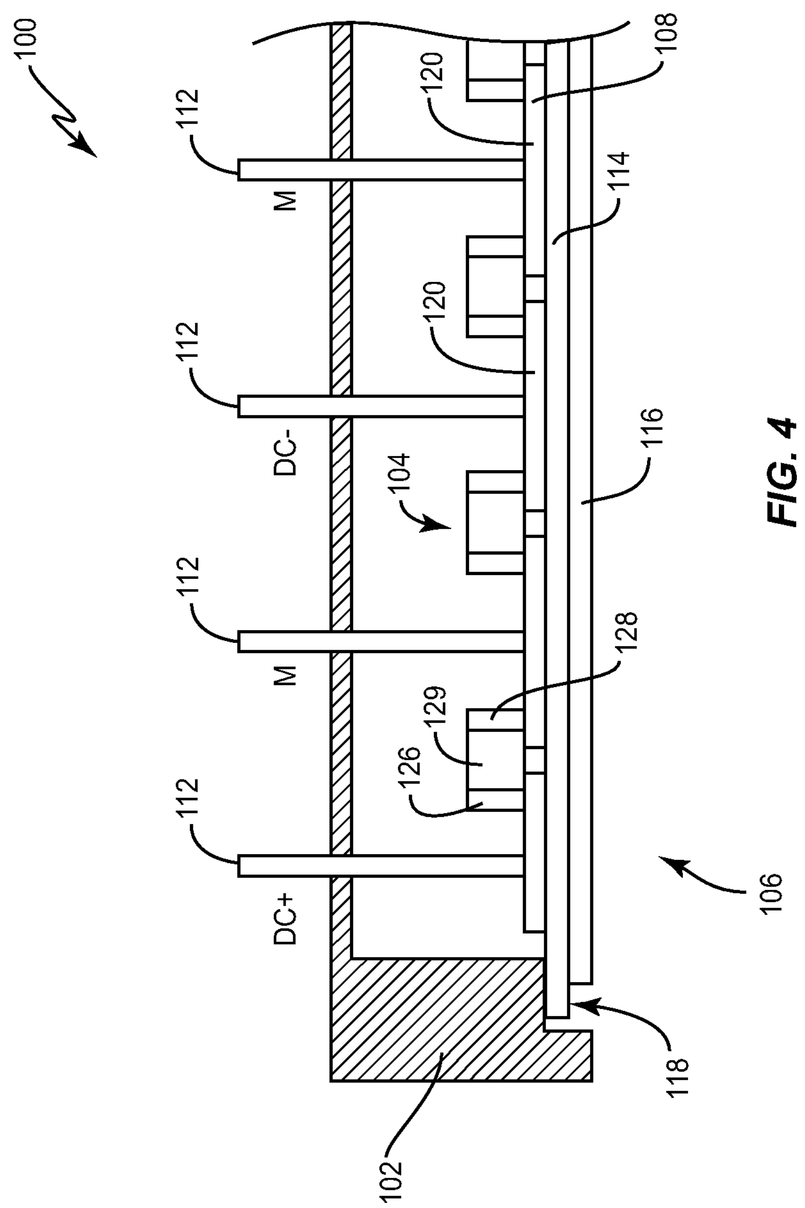
FIG. 4 illustrates a cross-sectional view of a capacitor module.

FIG. 4 illustrates a cross-sectional view of an embodiment of a capacitor module 100 which is similar to the one shown in FIG. 1, however the module shown in FIG. 4 has 3-levels (M, DC+, DC−) instead of 2-levels (DC+, DC−). Similar to the capacitor module 100 shown in FIG. 3, the capacitor module 100 of FIG. 4 has one row 105 of paralleled capacitors 104 connected in series with a second row 105 of paralleled capacitors 104 between the connectors 112 coupled to the DC+ and DC− supplies. In addition, a third level (M) is provided to the capacitor module 100 via a third row 113 of connectors 112 which are connected to the busbar 120 that provides the serial connection between the two sets 105 of capacitors 104 which are connected in series.

Figure 5:
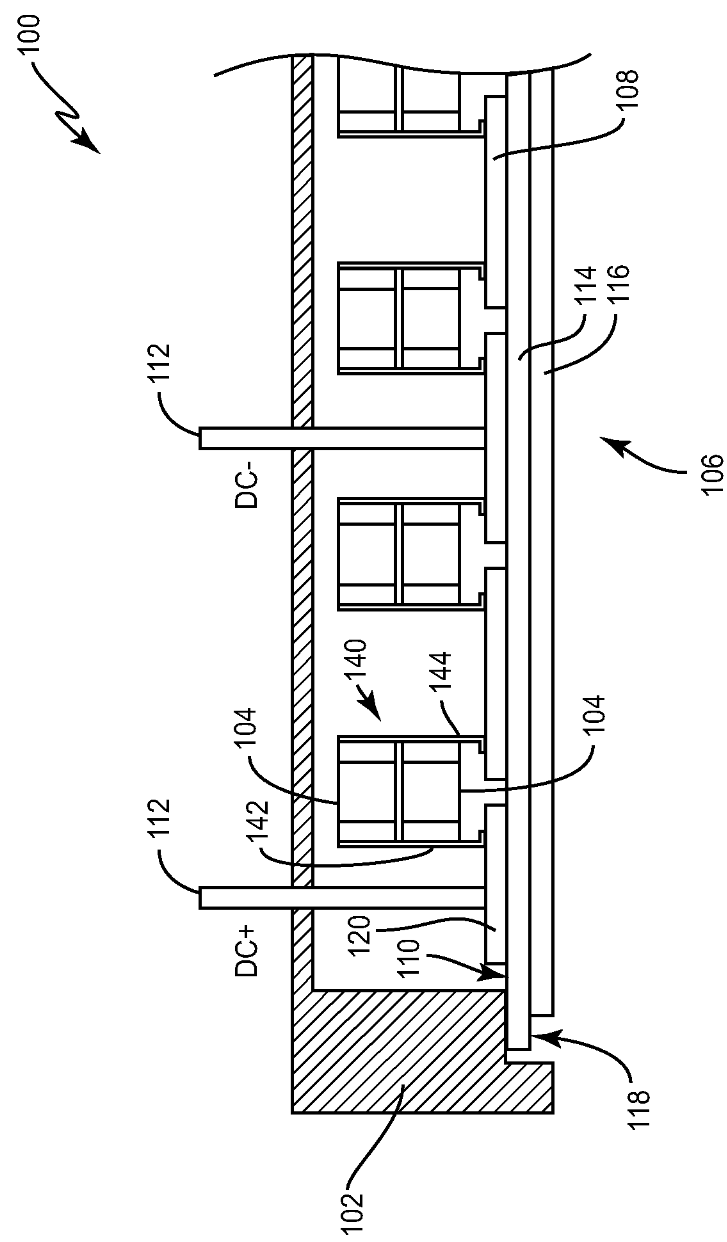
FIG. 5 illustrates a cross-sectional view of a capacitor module.

FIG. 5 illustrates a cross-sectional view of an embodiment of a capacitor module 100 which is similar to the one shown in FIG. 1. However in FIG. 5 capacitors 104 are not individually connected to the patterned metallization 108 on the substrate 106. Instead, groups of two or more capacitors 104 are packaged together as individual units 140. Each individual unit 140 has terminals 142, 144 which are connected to the corresponding busbars 120 on the substrate 106. As such, each row 105 of capacitors 104 includes several multi-capacitor units 140 coupled in parallel between two busbars 120.

Figure 6:
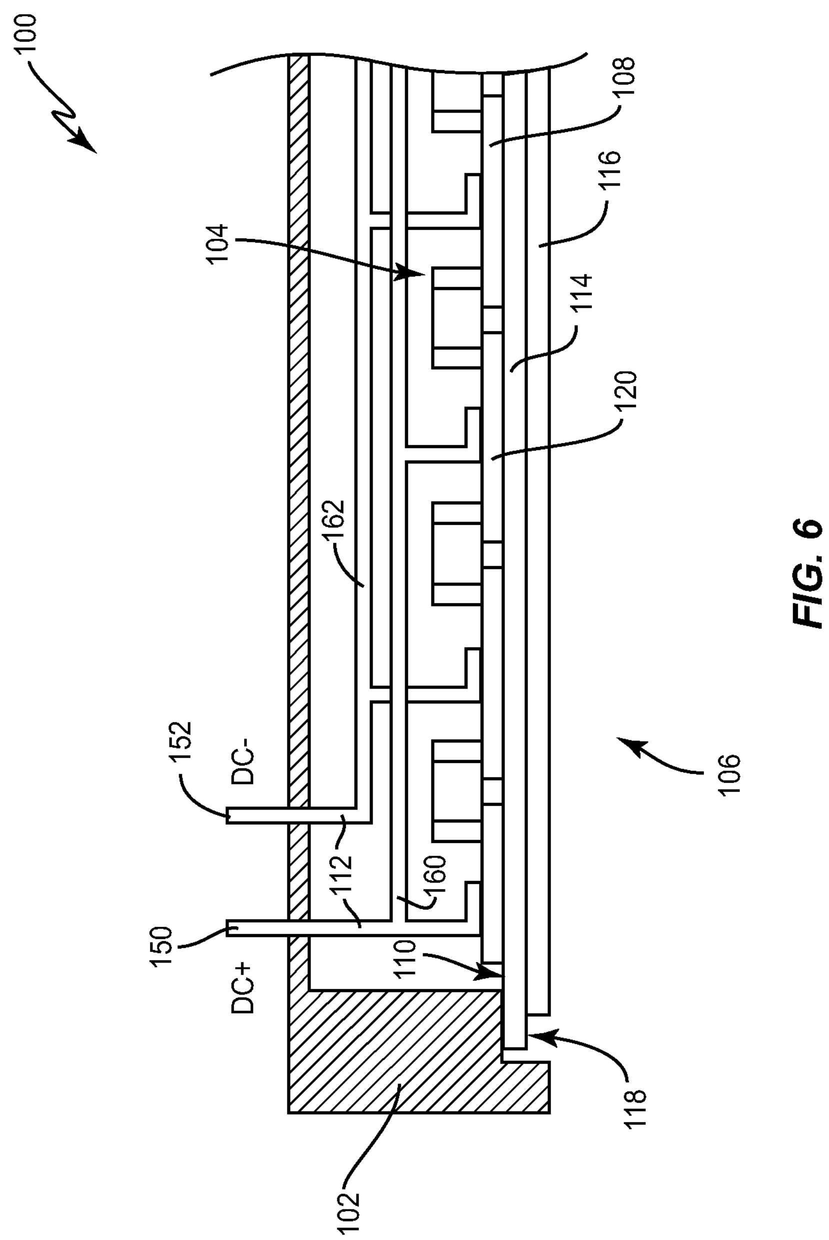
FIG. 6 illustrates a cross-sectional view of a capacitor module.

FIG. 6 illustrates a cross-sectional view of an embodiment of a capacitor module 100 which is similar to the one shown in FIG. 1. However in FIG. 6 a single row 150 of connectors 112 extends outside the capacitor module housing 102 for coupling to the DC+ supply. A second single row 152 of connectors 112 extends outside the housing 102 for coupling to the DC− supply. All other internal supply connections are made within the housing 102 using a first metal sheet 160 connected to the single row 150 of DC+ row connectors 112 and a second metal sheet 162 connected to the single row 162 of DC− connectors 112. The electrical connections between the capacitors 104 and the substrate metallization 108 are the same as in FIG. 1. Only the external connections are different in that a single row 150 of DC+ supply connections and a single row 152 of DC−supply connections are provided (FIG.

6) instead of several rows of DC+ supply connections and several rows of DC− supply connections (FIG. 1).

Figure 7:
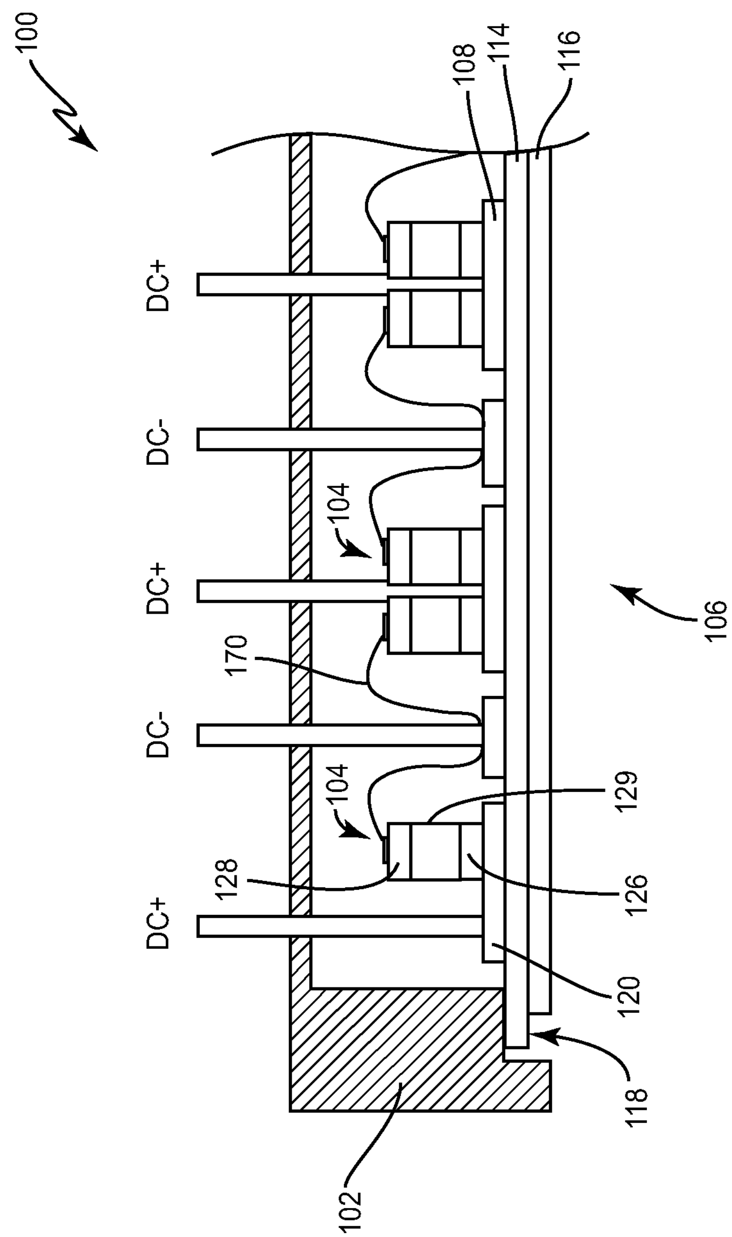
FIG. 7 illustrates a cross-sectional view of a capacitor module.

FIG. 7 illustrates a cross-sectional view of another embodiment of a capacitor module 100. According to this embodiment, a first end 126 of each capacitor 104 is directly connected to one busbar 120 of the patterned metallization 108 and the opposing end 128 of the capacitors 104 is electrically connected to the other corresponding busbar 120 of the patterned metallization 108. As such, the second (opposing) end 128 of the capacitors 104 included in each set of parallel connected capacitors is spaced apart from the patterned metallization 108 by the body 129 of the capacitor 104 and the other end 126 which is directly connected to a busbar 120. The end 128 of the capacitors 104 spaced apart from the patterned metallization 108 can be electrically connected to the appropriate busbar 120 e.g. by bond wires 170.

Figure 8:
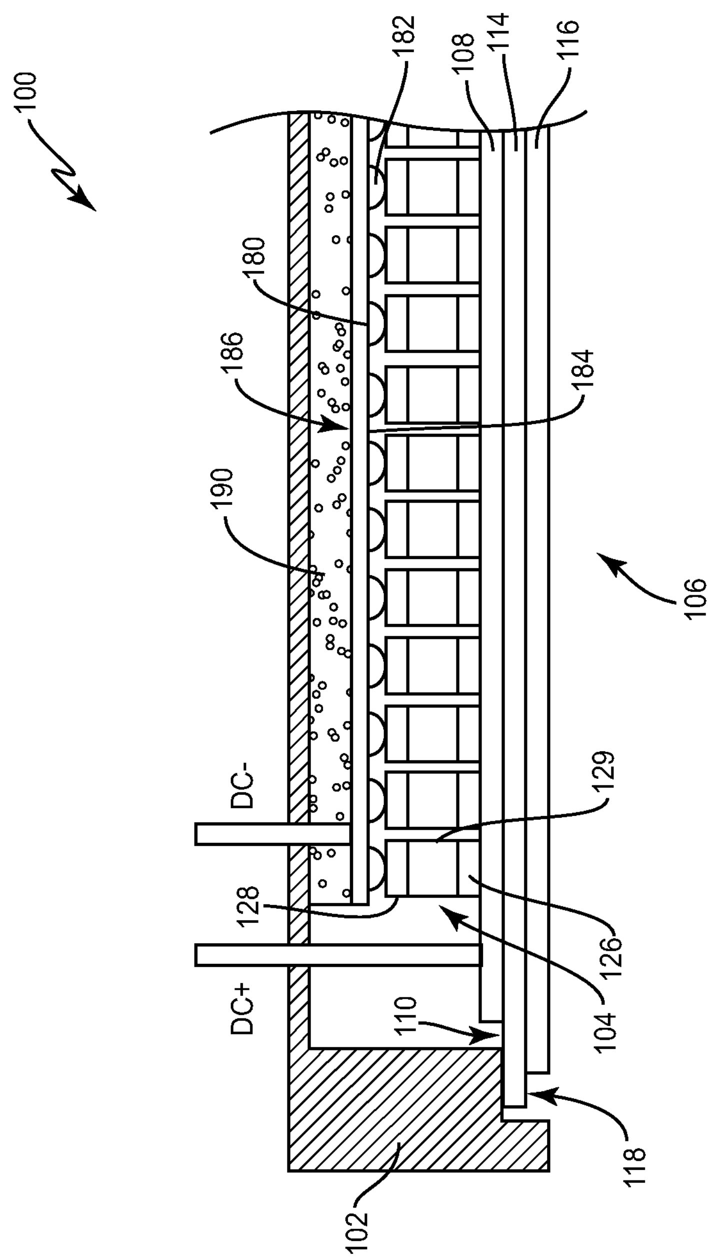
FIG. 8 illustrates a cross-sectional view of a capacitor module.

FIG. 8 illustrates a cross-sectional view of yet another embodiment of a capacitor module 100. According to this embodiment, a first end 126 of the capacitors 104 is directly connected to the substrate metallization 108 and a second opposing end 128 of the capacitors 104 is spaced apart from the metallization 108 and connected to an electrically conductive layer 180 disposed above the capacitors 104. The capacitors 104 are interposed between the electrically conductive layer 180 and the substrate 106. According to one embodiment, spring elements 182 are interposed between a bottom side 184 of the electrically conductive layer 180 and the capacitors 104. The spring elements 182 provide an electrical connection between the electrically conductive layer 180 and the second end 128 of the capacitors 104 which is spaced apart from the substrate metallization 108. According to another embodiment, a material 190 is interposed between the top side 186 of the electrically conductive layer 180 and the capacitor module housing 102. The material 190 presses the bottom side 184 of the electrically conductive layer 180 against the second (spaced apart) end 128 of the capacitors 104. The material 190 can be a flexible foam or other type of springy material.

FIG. 9 illustrates an embodiment of a power system 200 which includes a cooler 202, a capacitor module 100 as described previously herein, a power semiconductor module 204 and an electrical connection medium 206 such as a PCB or the like. The cooler 202 may be a passive cooler such as a heat sink (air cooled, liquid cooled or some combination of both) or an active cooler such as a thermoelectric cooler or other type of electrically power cooler. The capacitor module 100 and the power semiconductor module 204 are disposed on the cooler 202 and are separate components in the system 200. The electrical connection medium 206 is electrically connected to the connectors 112 of the capacitor module 100 which extend outside the module housing 102 and to connectors 208 of the power semiconductor module 204. The housing 102 of the capacitor module 100 may have an opening so that at least part of the metallization 116 on the bottom side 118 of the module substrate 106 can contact the cooler 202 as previously explained herein (see FIG. 1), providing a good thermal connection with the cooler 202.

In one embodiment, the first set of connectors 112 extending from the capacitor module housing 102 is coupled to a first supply voltage (DC+) of the power semiconductor module 204 via the electrical connection medium 206 and the second set of connectors 112 extending from the capacitor module housing 102 is coupled to a second supply voltage (DC−) of the power semiconductor module 204 also via the electrical connection medium 206. The capacitor module 100 is configured to operate as a DC-link for the power semiconductor module 204 according to this embodiment.

According to another embodiment, one or more additional capacitors 210 separate from the capacitor module 100 are provided. For example, these additional capacitors 210 may be of the electrolytic type. The one or more additional capacitors 210 store energy and are electrically connected to the electrical connection medium 206. The capacitor module 100 is configured to operate as a snubber according to this embodiment.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A capacitor module, comprising: a substrate having a metallization on a first side of the substrate; a plurality of connectors electrically coupled to the metallization; a plurality of capacitors disposed on the metallization and including a first set of capacitors electrically connected in parallel between a first set of the connectors and a second set of the connectors; and a housing enclosing the plurality of capacitors within the capacitor module so that the capacitors are enclosed on all sides, wherein at least some of the plurality of connectors extend through the housing so that part of these connectors is outside the housing; wherein the substrate comprises a ceramic substrate with the metallization disposed on a first side of the ceramic substrate and an additional metallization disposed on a second opposing side of the ceramic substrate, and wherein at least part of the additional metallization is exposed through an opening in the housing.

2. A capacitor module according to claim 1, wherein the plurality of capacitors are ceramic capacitors.

3. A capacitor module according to claim 1, wherein the first set of connectors are spaced apart over a collective width of the first set of capacitors, and wherein the second set of connectors are spaced apart over the collective width of the first set of capacitors.

4. A capacitor module according to claim 1, wherein the metallization is patterned and comprises a plurality of elongated regions separated from one another, and wherein the first set of capacitors are connected in parallel between a first pair of the elongated regions and a second set of the plurality of capacitors are connected in parallel between a second pair of the elongated regions.

5. A capacitor module according to claim 4, wherein the first and second pairs of elongated regions share a common elongated region, and wherein one end of the capacitors included in the first set and one end of the capacitors included in the second set are connected to the same elongated region.

6. A capacitor module according to claim 1, wherein at least two capacitors included in the first set of capacitors are stacked one above the other over the substrate and electrically connected in parallel between the first and second sets of connectors.

7. A capacitor module according to claim 1, wherein a first end of the capacitors included in the first set of capacitors is directly connected to a first elongated region of the metallization and a second opposing end of the capacitors included in the first set of capacitors is electrically connected to a second elongated region of the metallization, the first and second elongated regions being spaced apart from one another.

8. A capacitor module according to claim 7, wherein the second end of the capacitors included in the first set of capacitors is directly connected to the second elongated region of the metallization.

9. A capacitor module according to claim 1, wherein a first end of the plurality of capacitors is directly connected to the metallization and a second opposing end of the plurality of capacitors is spaced apart from the metallization and connected to an electrically conductive layer disposed above the plurality of capacitors with the plurality of capacitors interposed between the electrically conductive layer and the substrate.

10. A capacitor module according to claim 9, further comprising spring elements interposed between a first side of the electrically conductive layer and the plurality of capacitors, the spring elements providing an electrical connection between the electrically conductive layer and the second end of the plurality of capacitors.

11. A capacitor module according to claim 9, further comprising a material interposed between a second opposing side of the electrically conductive layer and the housing, the material pressing the first side of the electrically conductive layer against the second end of the plurality of capacitors.

12. A capacitor module according to claim 1, wherein the plurality of connectors are electrically conductive pins.

13. A capacitor module according to claim 1, wherein only first and second rows of the plurality of connectors extend outside the housing, and wherein connections within the housing between the first row of connectors and the metallization are provided by a first metal sheet and connections within the housing between the second row of connectors and the metallization are provided by a second metal sheet.

14. A power system, comprising: a cooler; a capacitor module on the cooler, the capacitor module comprising: a substrate having a metallization on a first side of the substrate; a plurality of connectors electrically coupled to the metallization; a plurality of capacitors disposed on the metallization and including at least a first set of capacitors electrically connected in parallel between a first set of the connectors and a second set of the connectors; and a housing enclosing the plurality of capacitors within the capacitor module so that the capacitors are enclosed on all sides, wherein at least some of the plurality of connectors extend through the housing so that part of these connectors is outside the housing; a power semiconductor module on the cooler; and an electrical connection medium electrically connected to the capacitor module through the part of the connectors that extend outside the housing and to the power semiconductor module; wherein the electrical connection medium is a printed circuit board.

15. A power system according to claim 14, wherein the first set of connectors is coupled to a first supply voltage of the power semiconductor module via the electrical connection medium and the second set of connectors is coupled to a second supply voltage of the power semiconductor module via the electrical connection medium, and wherein the capacitor module is configured to operate as a DC-link for the power semiconductor module.

16. A power system according to claim 14, further comprising one or more additional capacitors separate from the capacitor module and operable to store energy, and wherein the one or more additional capacitors are electrically connected to the electrical connection medium and the capacitor module is configured to operate as a snubber.

17. A power system according to claim 14, wherein the first set of connectors are spaced apart over a collective width of the first set of capacitors, and wherein the second set of connectors are spaced apart over the collective width of the first set of capacitors.

18. A power system according to claim 14, wherein the metallization is patterned and comprises a plurality of elongated regions separated from one another, and wherein the first set of capacitors are connected in parallel between a first pair of the elongated regions and a second set of the plurality of capacitors are connected in parallel between a second pair of the elongated regions.

19. A power system according to claim 14, wherein a first end of the plurality of capacitors is directly connected to the metallization and a second opposing end of the plurality of capacitors is spaced apart from the metallization and connected to an electrically conductive layer disposed above the plurality of capacitors with the plurality of capacitors interposed between the electrically conductive layer and the substrate.

* * * * *